United States Patent
Pellegrin et al.

(10) Patent No.: US 7,326,021 B2
(45) Date of Patent: Feb. 5, 2008

(54) DEVICE FOR LOADING AND UNLOADING SILICON WAFERS IN AN OVEN FROM A MULTIPLE-CASSETTE STATION

(75) Inventors: Yvon Pellegrin, Montpellier (FR); Claude Giral, Montpellier (FR)

(73) Assignee: Semco Engineeering, Montpellier (FR)

( * ) Notice: Subject to any disclaimer, the term of this patent is extended or adjusted under 35 U.S.C. 154(b) by 322 days.

(21) Appl. No.: 10/477,425

(22) PCT Filed: May 14, 2002

(86) PCT No.: PCT/FR02/01619

§ 371 (c)(1), (2), (4) Date: Apr. 19, 2004

(87) PCT Pub. No.: WO02/093617

PCT Pub. Date: Nov. 21, 2002

(65) Prior Publication Data

US 2004/0191027 A1   Sep. 30, 2004

(30) Foreign Application Priority Data

May 14, 2001  (FR)  ................................. 01 06756

(51) Int. Cl.
*B65G 25/04*  (2006.01)

(52) U.S. Cl. ...................................... 414/156; 414/941

(58) Field of Classification Search ................ 414/586, 414/587, 588, 217, 936, 941, 150, 156
See application file for complete search history.

(56) References Cited

U.S. PATENT DOCUMENTS

| 4,568,234 | A |   | 2/1986  | Lee et al. |
|-----------|---|---|---------|------------|
| 4,728,246 | A |   | 3/1988  | Mello |
| 5,030,057 | A |   | 7/1991  | Nishi et al. |
| 5,193,969 | A |   | 3/1993  | Rush et al. |
| 5,527,390 | A | * | 6/1996  | Ono et al. ................... 118/719 |
| 5,788,454 | A | * | 8/1998  | Thompson et al. ......... 414/811 |
| 5,820,266 | A | * | 10/1998 | Fedak ......................... 374/179 |
| 6,203,582 | B1| * | 3/2001  | Berner et al. .............. 29/25.01 |

FOREIGN PATENT DOCUMENTS

| EP | 0 798 763 | 10/1997 |
|----|-----------|---------|
| EP | 0 827 194 | 3/1998  |

* cited by examiner

Primary Examiner—Charles A Fox
(74) Attorney, Agent, or Firm—Young & Thompson

(57) ABSTRACT

Device for automatically loading and unloading a feed to be treated in a heat treatment unit (1) such as a diffusion oven, comprising at least a cantilever (2) designed to receive the whole feed and to introduce the feed in the oven. The feed can consist of silicon wafers (4) arranged in quartz boats. The device comprises a multiple-basket automatic transfer equipment receiving on a reception zone, the whole feed, and transferring, from the reception zone to the cantilever, the whole feed and optionally dummy feeds, shielding feeds and control elements and vice-versa after the heat treatment, transferring the whole treated feed to the reception zone and transferring, from the cantilever to their original locations, the shielding feeds and the control elements, the various operations being carried out according to a predetermined scenario.

21 Claims, 3 Drawing Sheets

DEVICE FOR LOADING AND UNLOADING SILICON WAFERS IN AN OVEN FROM A MULTIPLE-CASSETTE STATION

BACKGROUND OF THE INVENTION

The present invention relates to a device for loading and unloading wafers of semiconductor material such as silicon into equipment for chemical and thermal treatment such as horizontal diffusion ovens.

This invention is adapted for the industry of the production of semiconductor components.

The silicon wafers are transported into clean rooms in plastic boxes containing twenty-five wafers disposed in a plastic cassette with twenty-five positions called a basket, the different positions being defined by slots formed in the cassette. These silicon wafers are treated thermally in horizontal ovens after transfer of the plastic cassette on boats of thermally refractory material such as quartz and silicon carbide. These quartz or silicon carbide boats are disposed manually on a cantilever of silicon carbide in the form of an overhanging blade, or bitubes. Six to eight boats of fifty wafers are the normal load. In clean rooms, it is common to find transfer machines for one, or at most two baskets to a same boat containing thus twenty-five or fifty wafers disposed in twenty-five or fifty slots of the boat. The boat is manually placed on the cantilever following the stage, because the horizontal diffusion ovens comprise in general four superposed stages of which the upper stage is located about two meters off the ground.

This way of proceeding has the following drawbacks:
the presence of the human operator generates particles disposed on the micro-pattern of the integrated circuits, causing an electrical defect after passage through the oven.
The operator by positioning the boats on the cantilevers causes friction of refractory materials generating particles and hence electrical defects.
Moreover, the weight of a full boat, loaded with twenty-five to fifty wafers of one hundred fifty or two hundred millimeters is substantial and renders difficult the loading on the upper stages of the diffusion oven.

It should also be noted that the manual positioning of the boats on the cantilever is haphazard, which does not ensure repetitivity of the results subject to the insurance of a stable and unique position in the diffusion chambers.

Finally, by human error, the operator can return after treatment the wafers into bad cassettes, which does not permit following a lot in the course of the different steps of fabrication of the semiconductors.

To avoid these drawbacks, there exist elevator systems automatically loading each boat on the preliminarily selected stage. These elevators are supplied or supply an automatic transfer system from one or even at most two baskets.

This practice has the following drawbacks:
The load to be positioned on the cantilever results from eight to ten baskets of twenty-five wafers. The operator must feed the automatic transfer by his presence during the operation of loading or unloading.
moreover, specimen wafers for evaluation of the thermal process must be disposed in precise locations on the boats and recovered after thermal treatment for measurements. The operator positions them on the cantilever manually despite the automatic loading by the elevator.
On the other hand, the load of boats filled with silicon wafers and loaded on the cantilever must be framed with screening boats with a disc of quartz or silicon carbide.
Finally, by human error, the operator can return after a treatment the wafers into bad baskets, which does not permit following the lot in the course of the different steps of fabrication. The same problem arises as to the recovery of the specimens relative to their position on the load.

SUMMARY OF THE INVENTION

The present invention has for its object to solve these drawbacks by providing a new device integrating the complete loading and unloading of the load of the cantilever without a human presence.

To this end, the new device according to the invention for automatic loading and unloading of a load to be treated in a thermal treatment unit comprising at least one cantilever adapted to receive all the load to be treated, which load is constituted by several load elements physically independent from each other, said charge being constituted by an assembly of silicon wafers arranged in batches, each loading element being thus constituted by a wafer and said thermal treatment unit being constituted by at least one diffusion oven entered by the cantilever and the load it carries, which thus at this level is distributed among boats of quartz or other suitable material, characterized essentially in that it comprises multi-basket automatic transfer equipment receiving in a reception area, all the load to be treated, constituted by several load elements, and ensuring the transfer of the reception area toward the cantilever, of the totality of the load to be treated and if desired a false load, of screen loads and of specimen elements and conversely after thermal treatment, the transfer of all the treated load toward the reception area as well as the transfer of the cantilever toward the positions of origin of the screen loads and the specimen elements, the different operations of transfer being carried out according to a predefined scenario and prerecorded in a memory of a multitask supervisory unit, electrically connected to said transfer unit, said unit ensuring the supervision and control of at least the various transfer operations.

Thanks to these characteristics, the operator, before the loading of the cantilever begins, can position on the reception area all the load to be treated which at this precise position can be present in several batches physically separated from each other each constituted by several load elements disposed spaced from each other in a suitable basket. The load at this precise place is thus constituted by several removable baskets each containing several load elements. The user is thus able to position on the reception area several baskets each containing several load elements.

For application to the treatment of silicon wafers, the baskets are constituted by a synthetic material which does not resist the temperature required for the thermal treatment.

For this reason, according to another characteristic of the invention, the automatic transfer equipment first of all ensures the transfer of the load elements contained in the baskets of synthetic material toward the quartz boats and once each load is full, the transfer of this latter toward the cantilever.

According to another characteristic of the invention, the supervisory unit comprises a flat screen of the tactile type on which said unit displays different parameters as well as the various scenarios envisageable as to the operation of loading, each scenario defining particularly the positions of the boats, the number of product wafer or dummies, the position of the specimen plates on the dedicated boats, the automatic loading of the screen boats. Thus the user, by means of the tactile screen, selects the scenario and starts the multi-basket transfer operations.

According to another characteristic of the invention, the multi-basket automatic transfer equipment comprises:
- a multi-basket transfer station, comprising the reception area of the load constituted by the upper surface of a horizontal plate, on which area the baskets are disposed in a predetermined manner in precise positions, said area being provided to receive eight to twelve baskets that each can contain twenty-five load elements,
- an elevating manipulator with a system of a gripping head, electrically connected to the supervisory unit,
- an automatic multi-basket loading/unloading station connected electrically to the supervisory unit,
- a horizontal pivoting support for orientation connected electrically to the supervisory unit,
- one or several storage docks for empty boats,
- one or several intelligent storage docks for the boats containing screen loads, these docks being disposed near the manipulating elevator above the multi-basket automatic transfer station.

The reception area for the load at the multi-basket transfer station, according to one additional characteristic of the invention, comprises several pairs of positioning means for the baskets, defining the different positions of the baskets. According to an additional characteristic of the invention, the positioning means can be constituted by oblong openings provided in the horizontal plate of the transfer station, provided to receive shape-matingly the vertical positioning lips formed in the baskets.

According to an additional characteristic of the invention, the load elements of each basket are gripped by their edges by the automatic loading/unloading station. For silicon wafers whose treatment involves essentially at least one of their large surfaces, the automatic loading/unloading station grips the latter by their edges. There are thus avoided any alteration of their large surfaces. This station permits the automatic transfer of eight to twelve baskets on loaded boats in order, on the rotating support supplying full baskets and empty baskets. Moreover, the specimen plates are disposed automatically on the positions of the boats defined by the scenario of the supervisor of the unit.

The movement of the load during its transfer between the corresponding basket and the boat can be broken down into a vertical ascending movement of translation, followed by a horizontal movement of translation along a higher level followed by a descending vertical movement of translation. This transfer movement thus broken down can be carried out by the loading/unloading station but according to a preferred embodiment, at least the vertical transfer movement of the load elements of or toward the basket is ensured by a supplemental lifting member. Preferably, this lifting member is disposed below the horizontal plate of the transfer station and said plate in line with each basket comprises a through passage opening of the lifting member whilst the basket has no bottom such that said lifting member can act by pressing on the load elements whilst ensuring the maintenance of their position relative to each other.

According to another characteristic of the invention, a second lifting member is associated with the pivoting orienting horizontal support. Preferably, this second lifting member is disposed below the horizontal support, this latter being thus provided with a through opening for passage of said member. Moreover, each boat has no bottom, so as to permit the passage of the lifting member such that this latter can act by pressing on the load elements whilst ensuring the maintenance of their position relative to each other.

According to another characteristic of the invention, at least one of the lifting members is movable in rotation about a quarter turn about a vertical axis. This arrangement is particularly advantageous because, thanks to it, it is now possible to improve greatly the ergonomics of the automatic transfer station. Thus, it is now possible to be independent of a transverse or longitudinal position of each basket imposed by the transfer movement of the loading/unloading station and/or by the movements of the elevating manipulator. It is now possible to position the baskets on the plate in the best ergonomic way for the user, thereby reducing the dorsal movements of the operator to the minimum and decreasing the risk of pathologies connected with poor dorsal positions.

According to another characteristic of the invention, the elevating manipulator is of the four axis type and comprises a manipulating arm movable in a vertical direction and in two horizontal directions perpendicular to each other, said manipulating arm being provided with the gripping head.

With this elevator, according to an additional characteristic of the invention, are associated temperature detectors, force detectors and a means for adjusting the positioning of the cantilever by laser.

According to another characteristic of the invention, the automatic transfer station is provided with an automatic device for orientation of the wafers contained in each basket, each basket comprising an orientation flat surface. This device disposed below the plate of the automatic transfer station ensures the orientation of the wafers whilst these latter are still in their basket. This arrangement is electrically connected to the supervisory unit and is controlled and monitored by this latter.

According to still another characteristic of the invention, the plate of the automatic transfer station is movable in a horizontal plane so that in combination with the movements of the loading/unloading station, each basket will be positioned turn by turn adjacent this station.

According to still another characteristic of the invention, the baskets are arranged along lines and columns on the plate. In this case, the latter is mounted movably on horizontal guide slides in a direction perpendicular to the direction of horizontal movement of the loading and unloading station. As a modification, according to another embodiment, the baskets are arranged on the plate in a circle, in this case the plate is movable in rotation about a vertical axis passing through the center of the mentioned circle. In this configuration, the position occupied by the user for loading the plate is angularly offset by 90° relative to the lifting members. Thus the orientation of the basket during this latter is located above one or the other lifting element and is offset by 90° relative to what it had when it is loaded on the plate, this loading position being thus an ergonomic position.

Another advantage of this arrangement resides in the fact that it simplifies the production of the automatic transfer station. Thus, it is no longer necessary to give the associated lifting member a freedom of movement in rotation about a vertical axis.

According to another characteristic of the invention, the device is provided with a set of detectors to verify the normal procession of transfer sequences. A temperature detector verifies the temperature of the boats compatible with the synthetic material of the baskets.

BRIEFING DESCRIPTION OF THE DRAWING

Other advantages and characteristics of the invention will become apparent from a reading of the description hereafter, of forms of embodiment given by way of example, non-limiting and illustrated by the accompanying drawings, in which.

DETAILED DESCRIPTION OF PREFERRED EMBODIMENTS

Figure 1:
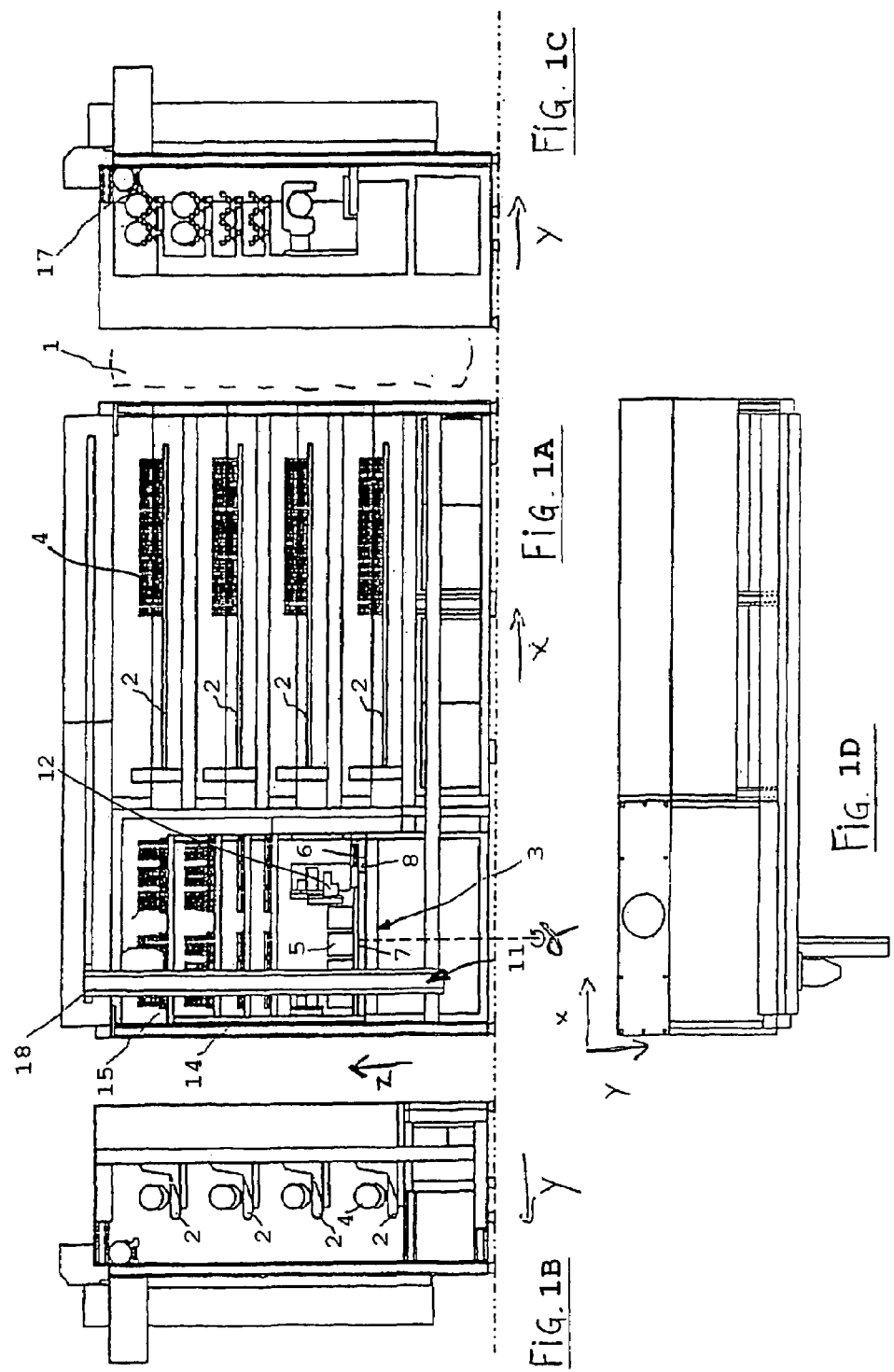
FIG. 1a is a front view of the apparatus according to the invention.
FIG. 1b is a view from the left of FIG. 1a, showing the device according to the invention.
FIG. 1c is a view from the right of FIG. 1a, of the device according to the invention.
FIG. 1d is a top plan view of the device according to the invention.
Figure 2:
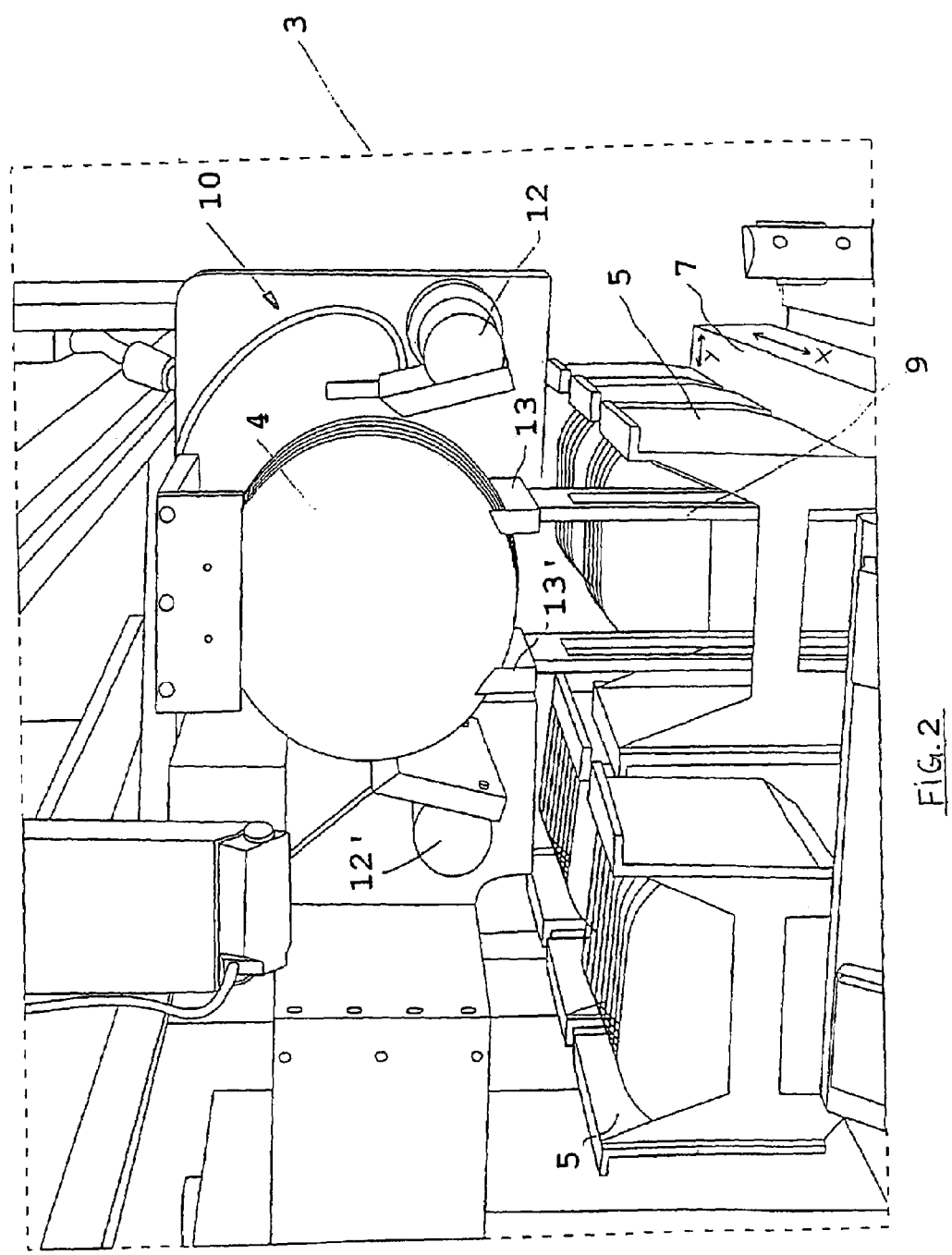
FIGS. 2 and 3 are perspective views of the automatic transfer device for wafers between baskets and boats.
Figure 3:
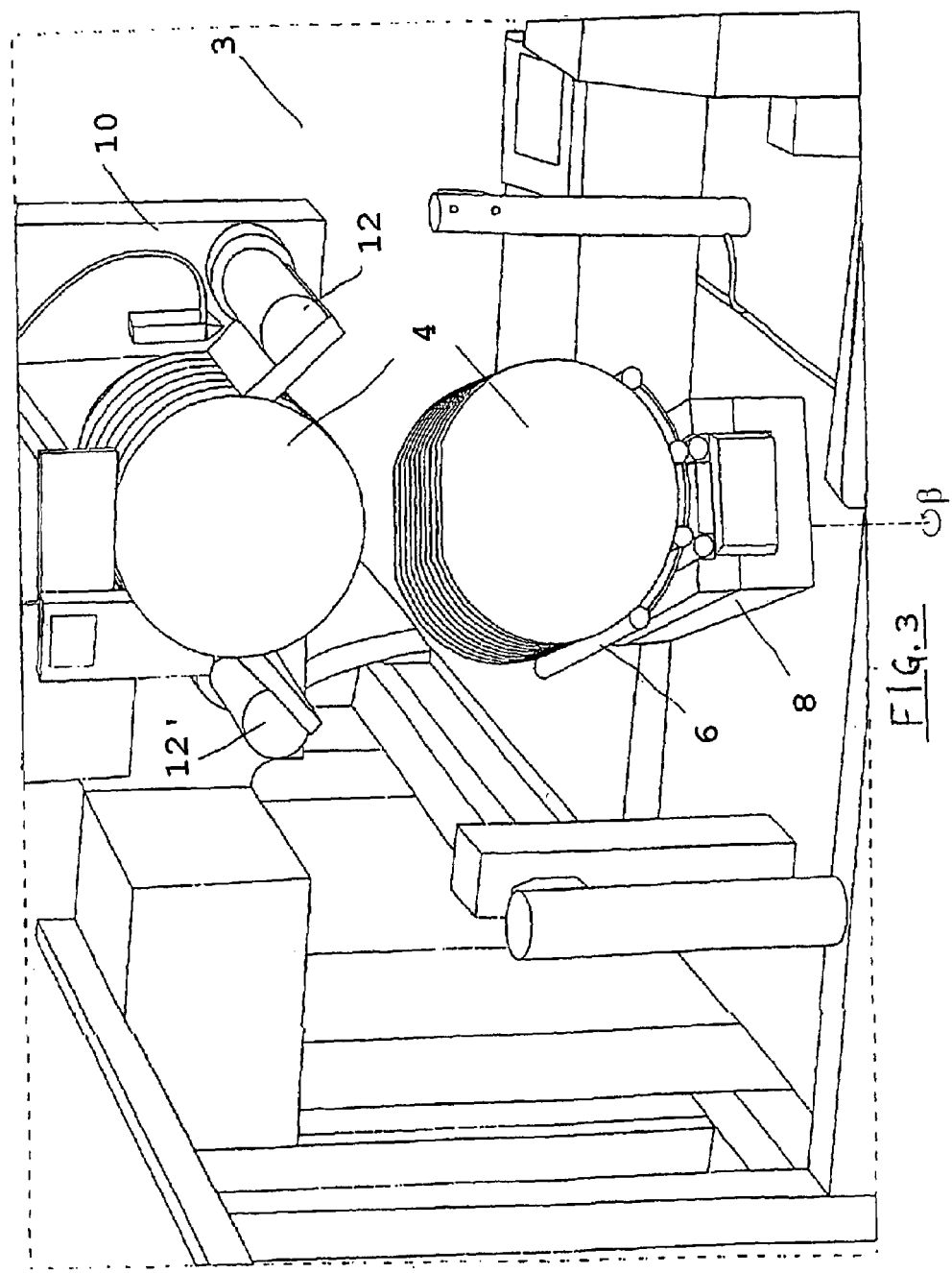

To facilitate the description of the movements of the different elements of the device, the direction X will represent the longitudinal direction of the device, Y the lateral direction and Z the vertical direction. These axes are clearly shown in FIGS. 1a to 1d.

In FIGS. 1a to 1d is shown the device according to the invention for the automatic loading and unloading of a load to be treated in a thermal treatment unit constituted by a diffusion oven 1 and several stages comprising several cantilevers adapted to receive quartz boats containing all of the charge to be treated, which charge is constituted by several load elements of the type of silicon wafers installed initially in baskets 5 of synthetic material. The cantilevers are each movable along X so as to insert the wafers in the oven 1. This device comprises automatic multi-basket transfer equipment receiving on a reception area, all the load to be treated, constituted by silicon wafers, disposed in baskets of synthetic material and ensure the transfer from the reception area toward the cantilever, of all of the load to be treated and is desired the dummy load, screen loads and specimen elements and conversely after thermal treatment, the transfer of all the treated load toward the reception area as well as the transfer of the cantilever toward various original positions, the screen loads and the specimen loads, the different operations of transfer being carried out according to a predefined scenario which is prerecorded in a memory of a multitask supervisor, electrically connected to said transfer equipment, said unit ensuring the monitoring and control of at least the various transfer operations. This transfer equipment thus ensures the automatic transfer of the wafers 4 between the baskets 5 and the boats 6. Thus, to resist the processing temperatures, the wafers initially contained in the baskets 5 of synthetic material must be transferred into boats 6 comprised generally of quartz. The shapes of the baskets and of the boats can be various. By way of example, shown in FIG. 1a, the baskets can have a parallelepipedal shape opening upwardly. The internal portion of the baskets is provided with notches for the positioning and holding of the wafers. The boats can be present in the form of a receptacle of incurved shape holding the base of the wafers in notches. Any other form of basket 5 and of boats are of course to be envisaged. By way of example, the baskets and the boats can contain twenty-five or fifty silicon wafers disposed in rows and spaced from each other by several millimeters.

The device moreover comprises:
a multi-basket transfer station 3, comprising a reception area for the load, constituted by the upper surface of a horizontal plate 7, on which area the baskets 5 are disposed in a predetermined manner in precise positions, said area being provided to receive eight to twelve baskets that each can contain twenty-five load elements,
a manipulating elevator 11 with a gripping head system 17, connected electrically to a supervisory unit,
a multi-basket automatic loading/unloading station 10 connected electrically to the supervisory unit,
a horizontal pivoting orientation support 8, pivotal about axis β, connected electrically to the supervisory unit,
several docks 14 for storage of empty boats,
several intelligent docks 15 for storage of boats containing screen loads, these docks being disposed adjacent the manipulating elevator above the multi-basket automatic transfer station.

The supervisory unit comprises a flat screen of the tactile type on which said unit displays different parameters as well as the various scenarios envisageable as to the operation of loading, each scenario defining particularly the positions of the boats, the number of product wafer or dummies, the positions of the specimen plates on the dedicated boats, the automatic loading of the screen boats. Thus the user by means of the tactile screen selects the scenario and starts the operation of multi-basket transfer.

The supervisory unit, for the loading operations of the cantilever 2, controls the elevator/manipulator 11 to raise by its gripping head 17 an empty boat 6 in the corresponding dock 15 and to transport and position this boat on the pivoting orientation support 8. Then this unit controls at the loading/unloading station 10 the raising of all of the batch of load elements contained in one of the baskets 5 and positions this batch in the boat. If the capacity of the boat permits receiving two batches of load elements, the supervisory unit controls the rotation by one half turn about a vertical geometric axis, of the horizontal orientation support 8 and then controls again the loading/unloading station 10 to raise all of the batch of elements of the load contained in another basket 5 and to position this batch in the boat. In this way a boat 6 is loaded with more capacity than the capacity of each basket. It can also be provided to position two boats 6 on the horizontal orientation support 8, in this case, the capacity of each boat is equal to that of each basket 5. After loading each boat, the supervisory unit controls the manipulating elevator 11 such that this latter can by its gripping head 17 seize the boat 6 and then transport and dispose the latter onto the cantilever 2. The supervisory unit also controls the manipulating elevator 11 such that this latter loads on the cantilever 2 screening boats. The preceding steps are repeated until the loading is terminated. The cantilevers 2 then introduce the full boats into the oven 1. Once the treatment is over, these boats are discharged and the wafer is reintroduced into the cassettes in the same cycle but in reverse manner.

The interest of automation of the loads for loading the cantilever and the supervision of the movements of the various elements taking part in the loading, resides in the fact that the boats are disposed in a particularly precise manner on the cantilever, which repetitivity of the results.

During the operation of loading the boat as described above, the supervisory unit can control and monitor the manipulating elevator 11 such that this latter accomplishes simultaneously and hence in overlapping time, other tasks, for example the loading on the cantilever of the screen boats.

The plate 7 of the automatic transfer station 3 is movable in a horizontal plane so that in combination with the movements of the loading/unloading station 10, it can position one by one each basket adjacent said station.

The plate 7 of the reception area of the multi-basket transfer station is arranged to receive simultaneously several baskets 5, for example eight to twelve, and to this end according to a first embodiment, this plate comprises several positions in which the operator will dispose the baskets. These various positions are preferably defined by several pairs of positioning means for the basket, in the form of different positions of the basket. The positioning means could be constituted by oblong openings provided in the horizontal plate of the transverse station. These openings are provided to receive shape-matingly the vertical positioning lips formed in the baskets.

According to a first embodiment, the baskets 5 are arranged along lines and columns on the plate. In this case this latter is movably mounted on horizontal slides for guidance in the direction Y, this direction being perpendicular to the direction of horizontal movement of the loading and unloading station 10.

As a modification, the baskets 5 are arranged on the plate 7 in a circle, in this case the plate is movable in rotation about a vertical axis α passing through the center of said circle. In this arrangement, the position occupied by the user for loading the plate is offset angularly by 90.degree. relative to the lifting members. Thus the orientation of the basket when this latter is located above one or the other lifting elements if offset by 90.degree relative to that which it has when it is loaded on the plate, this loading position being thus adapted to be an ergonomic position.

The movement of the load elements 4 during their transfer between the corresponding basket 5 and the boat, can be broken down into a vertical rising movement of translation, followed by a horizontal movement of translation at a new upper level, followed by a vertical descending movement of translation. This transfer movement thus broken down can be effected by the loading/unloading station but according to a preferred embodiment at least the vertical translation movement of the load elements from or toward the basket is ensured by a supplemental lifting member 9 movable vertically. Preferably, this lifting member 9 is disposed below the horizontal plate 7 of the transfer station 3 and said plate in line with each basket comprises a through opening for passage of the lifting member whilst the basket 5 has no bottom such that said lifting member can act by pressing on the load elements 4 whilst ensuring the maintenance of their position relative to each other. This lifting member has for its object to bring the load of wafers contained in the basket to a high level according to which it can be taken up by the loading/unloading station 10.

Preferably, a second lifting member is associated with the horizontal pivoting orientation support 8. Preferably, this second lifting member ensures the vertical movement of the load elements toward or from the boat, and is disposed below the horizontal support, this latter then being provided with a through opening for passage of said member. Moreover, each boat has no bottom so as to permit the passage of the lifting member such that the latter can act by pressing against the load elements whilst ensuring the maintenance of their position relative to each other.

For a plate movable in translation along the Y axis, at least one of the lifting members is movable in rotation about a quarter turn about a vertical axis, namely the Z axis.

This arrangement is particularly advantageous because, thanks to it, it is now possible to improve greatly the ergonomy of the automatic transfer station. Thus it is now possible to be freed from a transverse or longitudinal positioning of each basket 5 required by the transfer movement from the loading/unloading station 10 and/or by the movements of the elevating manipulator 11. It is now possible to position the baskets on the plate 7 in the best ergonomic position for the user, thereby reducing the dorsal movements of the operator to the minimum and decreasing the risk of injury associated with poor dorsal positions.

According to a preferred embodiment, the lifting member 9 is constituted by two horizontal pushers 13 and 13' spaced from each other and provided with slots for holding the wafers, said pushers being fixed to a same carrying structure secured to a motor element electrically connected to the supervisor unit.

According to a preferred embodiment, the automatic transfer station 10 is provided with an automatic device for orienting the wafers contained in each basket, each wafer comprising an orientation flat surface. This device disposed below the plate of the automatic transfer station ensures the orientation of the wafers whilst these latter are still in their basket. This device is electrically connected to the supervisor unit and is steered and controlled by this latter.

The loading/unloading station 10 is movable horizontally along the X axis and vertically along the Z axis. This station is provided with a gripping and holding device for the wafers during transfer, constituted by two jaws 12 and 12' each having an opposite movement of rotation and gripping the base of the series of wafers of the basket by their edges. The jaws 12 and 12' are each provided with slots for positioning the wafers.

The horizontal pivoting orientation support 8 receives the boats that are to be filled to be treated or the boats before being discharged. The support 8 is mounted rotatably about an axis Z and comprises at least two positions presented alternatively in the loading or unloading position by the loading/unloading station 10.

The elevating manipulator 11 is of the four axes type and comprises a manipulating arm movable in a vertical direction and in two horizontal directions perpendicular to each other, said manipulating arm being provided with the gripping head 17. As can be seen, the manipulating arm is movably mounted vertically on a vertical guide column 18 itself mounted movably by at least one of its ends on a horizontal guide rail extending in the X direction. The arm extends in the Y direction and is for example arranged telescopically to be movable in the Y direction. The gripping head 17 is mounted at the end of the arm and is arranged to grip from below the different boats for their transport. The gripping head is positioned below the boat, raises it from its support, disengages it from the device along the Y axis, and moves it from one station to the other.

With this elevator are associated temperature detectors, force detectors and a means for adjusting the position of the cantilever by a laser.

Finally, the device is provided with a set of detectors to verify the normal sequence of transfer events. A temperature detector verifies the temperature of the boats compatible with the synthetic material of the baskets.

The invention claimed is:

1. A device for automatically loading a load of silicon wafers to be treated in a diffusion oven and unloading treated silicon wafers from the diffusion oven, said load being placed on at least one cantilever adapted to receive all of a load to be treated, said load comprising a plurality of silicon wafers initially arranged in batches in a plurality of baskets, said device comprising:

automatic multi-basket transfer equipment receiving on a reception area all the load to be treated, and effecting, after thermal treatment, the transfer of all of a treated load toward the reception area in their original positions according to a predetermined scenario and prerecorded in a memory of a multi-task supervisory unit that is electrically connected to said transfer equipment, the supervisory unit ensuring the supervision and control of various transfer operations, wherein the automatic multi-basket transfer equipment comprises:

an automatic multi-basket transfer station, which includes said reception area having an upper surface of a horizontal plate, said load of silicon wafers to be treated being disposed on said horizontal plate in said baskets in an ordered manner in precise positions, said reception area being structured and arranged to receive eight to twelve baskets that each contain twenty-five wafers, a horizontally pivotal orientation support that supports at least one boat and that is electrically connected to the supervisory unit, an automatic multi-basket loading/unloading station that transfers the wafers from at least one of said baskets to said at least one boat, and that is electrically connected to the supervisory unit, a manipulating elevator having a system of ripping heads, said manipulating elevator transporting said at least one boat to said at least one cantilever and being electrically connected to the supervisory unit, at least one dock for storing empty boats, and at least one intelligent dock for storing boats containing screen loads, said intelligent dock being disposed adjacent to the manipulating elevator above the automatic multi-basket transfer station.

2. The device according to claim 1, wherein the automatic transfer equipment transports load elements contained in the baskets to the boats, and once each of the boats is full, the automatic transfer equipment transfers the boats toward the cantilever.

3. The device according to claim 1, wherein the supervisory unit comprises a tactile flat screen that displays different parameters as well as various scenarios related to the operation of loading, each scenario defining positions of the boats, the number of product wafers or blanks, the positions of specimen plates on the boats, and automatic loading of screen boats.

4. The device according to claim 1 further comprises, in the reception area, several pairs of positioning means for defining the different positions of the baskets.

5. The device according to claim 4 wherein the positioning means comprise oblong openings provided in the horizontal plate.

6. The device according to claim 4, wherein the plate is movable in a horizontal plane such that in combination with movements of the loading/unloading station each basket can be positioned in turn adjacent said loading/unloading station.

7. The device according to claim 6, wherein the baskets are arranged in lines and columns on the plate.

8. The device according to claim 7, wherein the plate is movably mounted on horizontal slideways for guidance in a direction perpendicular to a direction of horizontal movement of the loading and unloading station.

9. The device according to claim 6, wherein the baskets are arranged on the plate in a circle, and the plate is movable in rotation about a vertical axis passing through a center of the circle.

10. The device according to claim 1, wherein movement of the wafers during their transfer between a respective basket and the at least one boat is broken down into a vertical ascending movement of translation, followed by a horizontal movement of translation followed by a vertical descending movement of translation.

11. The device according to claim 10, further comprising a supplemental raising member disposed below the horizontal plate that effects at least the vertical translation movement of the wafers from or to the basket, said plate comprises a through opening for passage of the supplemental raising member and the basket has no bottom such that said supplemental raising member presses against the wafers while maintaining a position of the wafers relative to each other.

12. The device according to claim 11 wherein the supplemental raising member is movable in rotation by a quarter turn about a vertical axis.

13. The device according to claim 10 further comprising a second lifting member to ensure the vertical movement of the load elements toward or away from the boat, said second member being disposed below the horizontally pivotal orientation support, the horizontally pivotal orientation support having a through passage opening for said second member and each boat having no bottom so as to permit the passage of the second lifting member so that the second lifting member presses against the wafers while maintaining a position of the wafers relative to each other.

14. The device according to claim 4, wherein the automatic transfer station has a device for automatic orientation of the wafers contained in each basket, each wafer comprising a flat orientation surface.

15. The device according to claim 4, wherein the loading/unloading station is movable horizontally along the X axis and vertically along the Z axis and that said station is provided with a gripping and holding device for the wafers during transfer.

16. The device according to claim 15, wherein the gripping and holding device comprises two jaws each actuated with an opposite movement of rotation and gripping a base of a series of wafers by respective edges, the jaws each having slots for positioning the wafers.

17. The device according to claim 4, wherein the orientation support is rotatably mounted about a Z axis and is alternatively moved by the loading/unloading station in a position for loading at least one boat and in a position for unloading at least one boat.

18. The device according to claim 4, wherein the elevating manipulator is a four axis elevating manipulator and comprises a manipulating arm movable in a vertical direction and according to two horizontal directions perpendicular to each other, said manipulating arm being provided with said gripping head.

19. The device according to claim 18, further comprising temperature detectors, force detectors and a means for adjusting the positioning of the cantilever that works in conjunction with a laser.

20. The device according to claim 1 further comprising a set of detectors to verify the normal progress of the sequences of transfer and at least one temperature detector to verify the temperature of the boats.

21. A device for automatically loading silicon wafers to be treated in a diffusion oven and unloading treated silicon wafers from the diffusion oven, said device comprising:
- an automatic multi-basket transfer station having a reception area, said reception area including an upper surface of a horizontal plate, said load of silicon wafers to be treated being disposed on said horizontal plate in plural baskets in an ordered manner in precise positions,
- a horizontally pivotal orientation support that supports at least one boat and that is electrically connected to the supervisory unit,
- an automatic multi-basket loading/unloading station that transfers the wafers from at least one of said baskets to said at least one boat, and after thermal treatment, transfers all of a treated load toward the reception area in their original positions according to a predetermined scenario and prerecorded in a memory of a multi-task supervisory unit, said automatic multi-basket loading/unloading station being electrically connected to the supervisory unit,
- a manipulating elevator having a system of gripping heads, said manipulating elevator transporting said at least one boat to at least one cantilever for insertion into said diffusion oven, said manipulating elevator being electrically connected to the supervisory unit,
- at least one dock for storing empty boats, and
- at least one intelligent dock for storing boats containing screen loads.

* * * * *